(12) United States Patent
Shinomiya et al.

(10) Patent No.: US 6,977,686 B2
(45) Date of Patent: Dec. 20, 2005

(54) SOLID-STATE IMAGE PICKUP APPARATUS LIMITING ADHESIVE INTRUSION

(75) Inventors: Kohji Shinomiya, Tokyo (JP); Yasuyuki Endo, Tokyo (JP); Shinsuke Igarashi, Chiba-ken (JP)

(73) Assignees: Renesas Technology Corp., Tokyo (JP); Seiko Precision Inc., Chiba-Ken (JP)

( * ) Notice: Subject to any disclaimer, the term of this patent is extended or adjusted under 35 U.S.C. 154(b) by 779 days.

(21) Appl. No.: 09/799,690

(22) Filed: Mar. 7, 2001

(65) Prior Publication Data

US 2002/0044213 A1 Apr. 18, 2002

(30) Foreign Application Priority Data

Oct. 13, 2000 (JP) .............................. 2000-313248

(51) Int. Cl.$^7$ ............................................ H04N 5/225
(52) U.S. Cl. ...................... 348/340; 438/106; 438/108; 257/778; 257/787; 257/792
(58) Field of Search ................. 257/E31.127, E23.065, 257/787, 678, 778, 772, 792; 438/108, 106, 438/118, 64, 70; 348/340; 29/841; 250/208.1; 600/109

(56) References Cited

U.S. PATENT DOCUMENTS

| | | | |
|---|---|---|---|
| 3,686,698 A | * | 8/1972 | Akeyama et al. ........... 257/772 |
| 5,218,234 A | * | 6/1993 | Thompson et al. ......... 257/787 |
| 5,677,200 A | * | 10/1997 | Park et al. .................... 438/70 |
| 5,704,896 A | * | 1/1998 | Fukunishi et al. .......... 600/109 |
| 5,786,589 A | * | 7/1998 | Segawa et al. .......... 250/208.1 |
| 6,043,482 A | | 3/2000 | Hagl et al. |
| 6,291,264 B1 | * | 9/2001 | Tang et al. ................. 438/106 |
| 6,571,466 B1 | * | 6/2003 | Glenn et al. .................. 29/841 |
| 6,577,342 B1 | * | 6/2003 | Wester ....................... 348/340 |
| 6,605,828 B1 | | 8/2003 | Schwarzrock et al. |
| 2001/0055073 A1 | | 12/2001 | Shinomiya |

FOREIGN PATENT DOCUMENTS

| | | | |
|---|---|---|---|
| DE | 196 14 378 | | 11/1996 |
| DE | 196 51 260 | | 1/1998 |
| DE | 198 10 060 | | 11/1998 |
| JP | 7-95485 | | 4/1995 |
| JP | 09-357410 | * | 7/1999 .......... H04N 5/335 |
| JP | 11-191864 | | 7/1999 |

* cited by examiner

*Primary Examiner*—David L. Ometz
*Assistant Examiner*—Brian Jelinek
(74) *Attorney, Agent, or Firm*—Leydig, Voit & Mayer, Ltd.

(57) ABSTRACT

A solid-state image pickup apparatus includes a solid-state image pickup device having a layer of microlenses above a color filter. The solid-state image pickup device is mounted on a side of a flexible printed circuit board by flip-chip bonding, opposite the opening. An adhesive in a gap between the solid-state image pickup device and the flexible printed circuit board strengthens the apparatus. The distance between the edge of the microlens layer and the edge of the flexible printed circuit board defining the opening and nearest to the microlens layer is 2.5 to 10 times wider than the gap between the solid-state image pickup device and the flexible printed circuit board.

3 Claims, 7 Drawing Sheets

SOLID-STATE IMAGE PICKUP APPARATUS LIMITING ADHESIVE INTRUSION

FIELD OF THE INVENTION

The present invention, in general, relates to a solid-state image pickup apparatus including a solid-state image pickup device and an optical lens. More particularly, this invention relates to a compact and high-performance solid-state image pickup apparatus.

BACKGROUND OF THE INVENTION

A conventional solid-state image pickup apparatus had a structure as shown in FIG. 6 in order to realize a slim and small apparatus. Legend 1 denotes a flexible printed circuit board (hereafter referred to as FPC) made with a film material such as polyimide. The FPC 1 is this figure is shown in a bent state. Legend 13 denotes a frame which holds an optical lens 6 and an optical filter 7. Legend 8 denotes a diaphragm section which takes in light from the outside. Legend 4 denotes a holding mount which holds the optical filter 7. This holding mount is fixed to the FPC 1. Legend 5 denotes a holding cap which holds the optical lens 6 and is disposed movably with respect to the holding mount 4 to obtain correct focus.

The holding mount 4 and the holding cap 5 are kept in a movable state to adjust position so that incident light from the diaphragm section 8 comes into focus on a solid-state image pickup device 9 through the optical filter 7. At the same time, an aperture 14 is provided in the FPC 1 to receive incident light from the optical lens 6. FIG. 6 shows a constitution where an IC component 10, such as a chip for image signal processing, is flip-chip bonded to the FPC 1 in the same manner as the case of the solid-state image pickup device 9. FIG. 6 also shows a constitution, as specific example, where chip components 12 such as resistors or capacitors are mounted on the FPC 1.

The operation of the solid-state image pickup apparatus will be explained below. The light coming in through the diaphragm 8 passes through the optical lens 6 and further passes through the optical filter 7. This light is then irradiated onto an image pickup area of the solid-state image pickup device 9 to form an image. Video information of the image is converted into electric signals in the solid-state image pickup device 9 and electrically transmitted to the FPC 1 via a flip-chip bonding pad section 11. The electric signals are further transmitted to the signal processing chip 10 and the lands provided on the FPC through the printed wiring of the FPC 1.

FIG. 7 shows an enlarged cross-section of the portion of the flip-chip bonding pad section 11 indicated by dashed lines in FIG. 6. A liquid adhesive with epoxy resin as its main component, which is referred to as underfill indicated by legend 31, is injected into the periphery of the flip-chip bonding pad section 11, and the underfill 31 is hardened to mechanically reinforce the electrical contact portion of the flip-chip bonding pad section 11, although this constitution is not shown in FIG. 6.

Thus, in the conventional solid-state image pickup apparatus, the flip-chip bonding pad sections 11 are provided for electrical contact between the solid-state image pickup device 9 and the FPC 1, and the underfill 31 is required for the periphery of the section.

This underfill 31 is injected into the periphery of the flip-chip bonding pad sections 11 in order to mechanically reinforce electrical contact portions between the flip-chip bonding pad section 11 and the land (contact edge) of the FPC 1, and the flip-chip bonding pad section 11 and the pad (contact edge) of the solid-state image pickup device 9. For the reinforcement, it is important that the underfill 31 is kept in contact with the FPC 1, the flip-chip bonding pad sections 11, and the solid-state image pickup device 9. Accordingly, the underfill 31 is originally a liquid with low viscosity, and a large amount of liquid is injected into the periphery. Since it is required to utilize this type of manufacturing process, an overflow of the underfill 31, which is referred to as bleed and indicated by legend 32, may occur.

On the other hand, the solid-state image pickup device 9 has an image pickup area 21 including photodiodes and transistors. Light reflected from a subject passes through the diaphragm 8, lens 6, and optical filter 7, further passes through a microlens 23 and a color filter 22 to form an image on the photodiodes corresponding to respective pixels forming the image pickup area 21.

When the underfill 31 covers the microlens 23 in the form of the bleed 32, the solvent of the underfill as the bleed 32 spreads over a large area, by a capillary phenomenon, along V-shaped grooves extending vertically and horizontally, like a checkerboard, which are specific to the area of the microlens 23 based on its form. Eventually, the bleed may reach the image pickup area 21. In such a case, the optical characteristics of the microlens 23 are disturbed because of the presence of the underfill 31. Resultantly, the light can not be focused on the photodiodes of the pixel area 21, which causes the image pickup sensitivity to be reduced.

SUMMARY OF THE INVENTION

In the solid-state image pickup apparatus according to one aspect of this invention, a solid-state image pickup device is provided on one side of a flexible printed circuit board and an optical lens is provided on the other side of the board, and the solid-state image pickup device is flip-chip bonded to the flexible printed circuit board. An aperture is provided on the flexible printed circuit board, so that light coming in from this aperture is focused on an image pickup area of the solid-state image pickup device. A distance between an edge of a microlens area formed on the solid-state image pickup device and an edge of the flexible printed circuit board is between 2.5 times to 10 times wider as compared to a space between the flexible printed circuit board and the solid-state image pickup device.

In the solid-state image pickup apparatus according to another aspect of this invention, a projection is provided on the surface of the solid-state image pickup device between an edge of a microlens area formed on the solid-state image pickup device and an edge of the flexible printed circuit board.

In the solid-state image pickup apparatus according to still another aspect of this invention, a groove is provided on the surface of the solid-state image pickup device between an edge of a microlens area formed on the solid-state image pickup device and an edge section of the flexible printed circuit board.

In the solid-state image pickup apparatus according to still another aspect of this invention, a stage is provided on said solid-state image pickup device between an edge of a microlens area formed on the solid-state image pickup device and an edge of the flexible printed circuit board.

In the solid-state image pickup apparatus according to still another aspect of this invention, a bank is provided near around an edge of said flexible printed circuit board.

Other objects and features of this invention will become apparent from the following description with reference to the accompanying drawings.

DESCRIPTION OF THE PREFERRED EMBODIMENTS

Preferred embodiments of this invention will be explained below with reference to the attached drawing.

Figure 1:
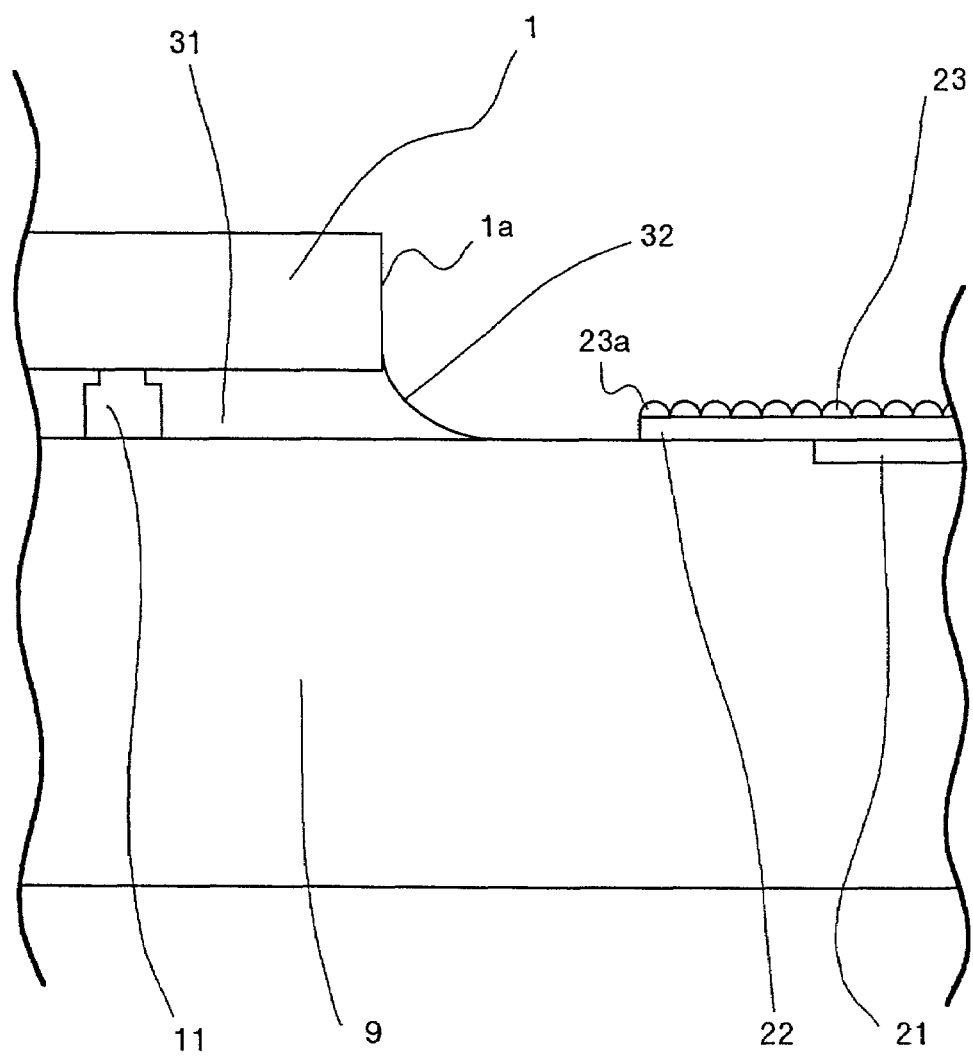
FIG. 1 is a cross-sectional view of a solid-state image pickup apparatus according to a first embodiment of this invention.
Figure 6:
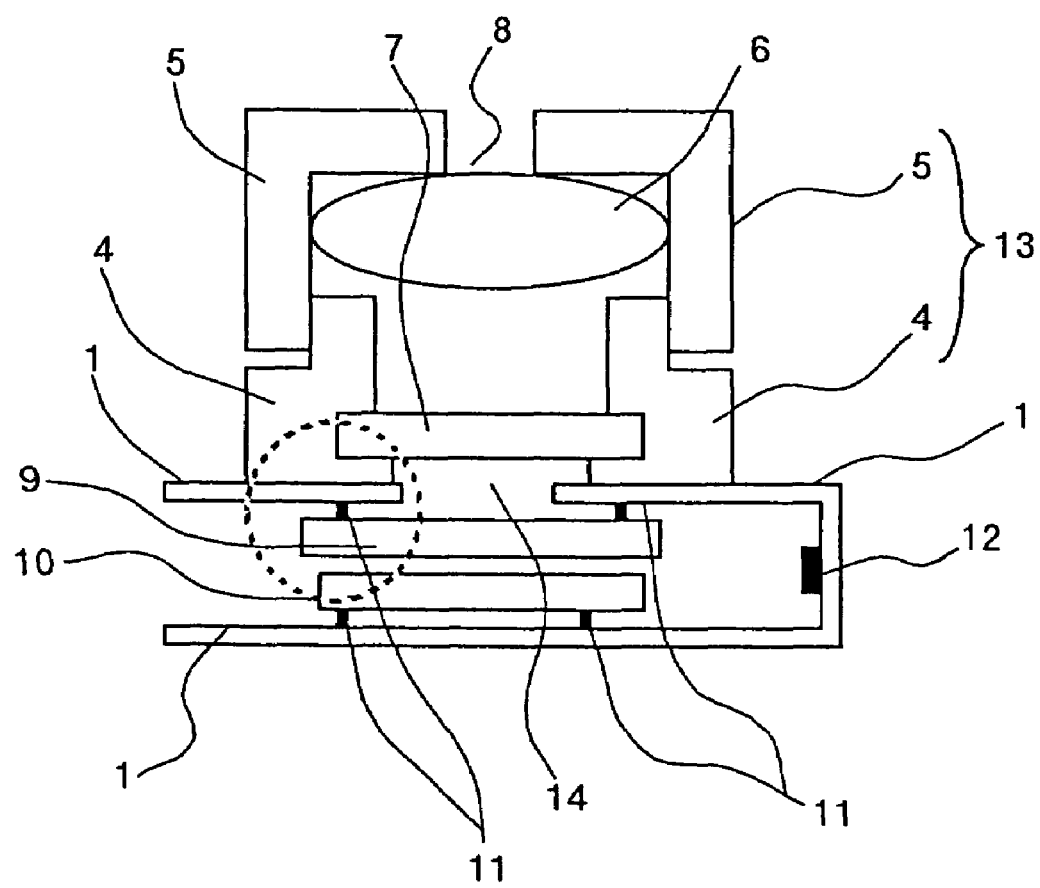
FIG. 6 is a cross-sectional view of the conventional solid-state image pickup apparatus.
Figure 7:
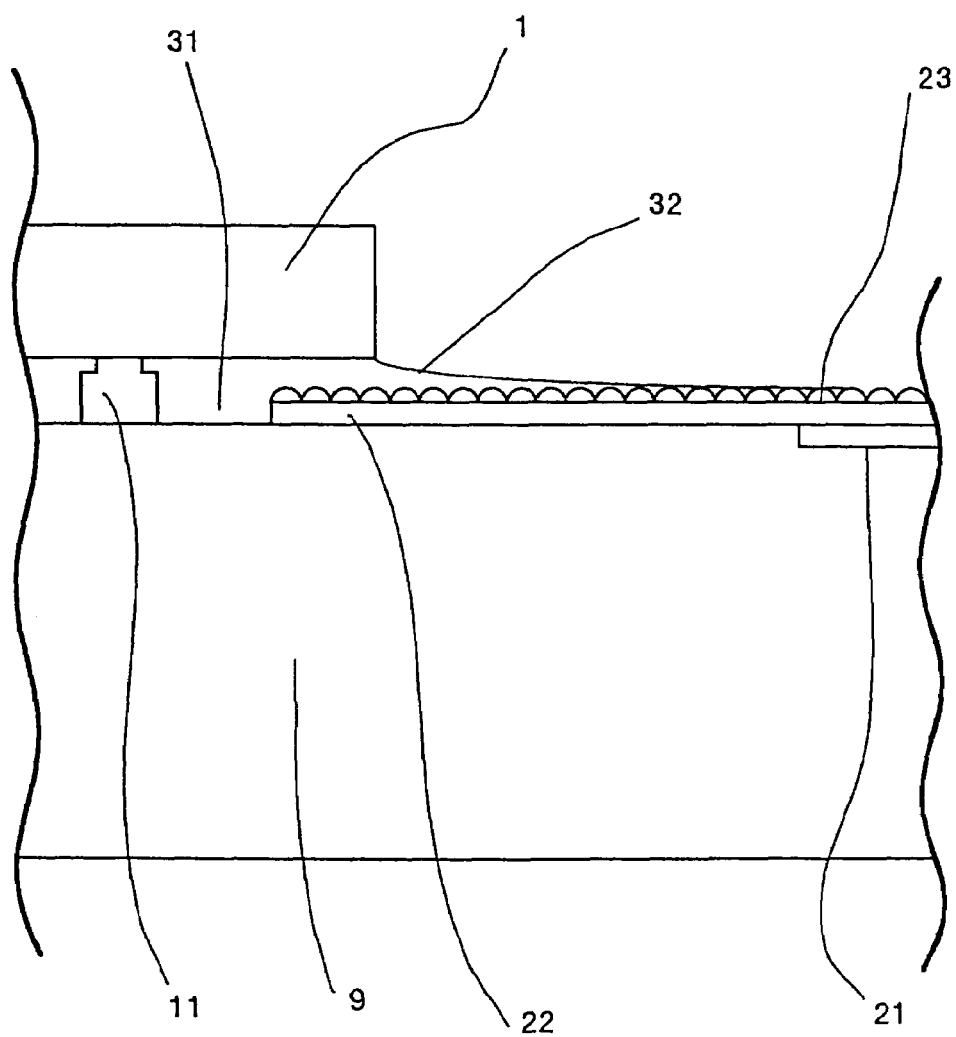
FIG. 7 is a partially enlarged view of the conventional solid-state image pickup apparatus.

FIG. 1 shows an enlarged cross-sectional view of the portion of a flip-chip bonding pad section 11 in the solid-state image pickup apparatus according to a first embodiment. Legend 1 denotes the flexible printed circuit board (FPC) made with a film material such as polyimide. Light falls on the image pickup area 21 via the microlens 23 and the color filter 22 of the solid-state image pickup device 9, through the hole 14 (see FIG. 6), to form an image. Legend 1a in FIG. 1 denotes microlens-side edge of the FPC 1, and legend 23a denotes an edge of the microlens 23.

A liquid adhesive with epoxy resin, etc., as its main component, which is referred to as underfill indicated by legend 31, is flown into the periphery of the flip-chip bonding pad section 11. The underfill 31 is hardened to mechanically reinforce an electrical contact portion, formed with an electrically conductive adhesive such as silver paste, of the flip-chip bonding pad section 11.

The inventor of this invention carried out studies on how much should be the distances between the microlens-side edge 1a of the FPC 1 and the edge 23a of the microlens 23 so that of the bleed 32 the underfill 31 will not touch the microlens 23. Such study was performed because if the bleed 32 can be prevented from entering into the gaps between the microlens it will not spread over a large area. That is, the solvent will not spread up to the image pickup area 21, so that the optical characteristics of the microlens 23 are not disturbed. Thus, light can be focused on the photodiodes of the pixel area 21, and the reduction in its image pickup sensitivity can be prevented.

The inventors found that the volume of the bleed 32 is proportional to a space between the FPC 1 and the solid-state image pickup device 9. In other words, the underfill 31 will not reach the microlens if the microlens-side edge 1a and the edge 23a are provided apart from each other by a distance which is 2.5 times or more as wide as the space between FPC 1 and the solid-state image pickup device 9. The space between the FPC 1 and the solid-state image pickup device 9 is generally of the order of tens of micrometers. If resin having a flow property necessary and sufficient to be able to fill in this space, then provision of a gap of not less than 2.5 times as wide as the space between the FPC 1 and the solid-state image pickup device 9 can prevent the underfill 31 from its reaching the microlens.

More specifically, if an average space between the FPC 1 and the solid-state image pickup device 9 is 50 $\mu$m, then the distance between the microlens-side edge 1a and the edge 23a should be 125 $\mu$m.

However, if this distance is too wide, the image pickup area 21 is reduced, which is not practical. It is preferable and practical that this distance is not more than 10 times as wide as the space between the FPC 1 and the solid-state image pickup device 9.

More concretely, when an average space between the FPC 1 and the solid-state image pickup device 9 is 50 $\mu$m, it is preferable that the gap between the FPC aperture edge section 1a and the microlens area edge section 23a is 500 $\mu$m or less.

FIG. 1 shows a structure in which the edge of the color filter 22 is aligned with the edge 23a of the microlens 23 thereby forming a stage. Provision of such a stage can also prevent the solvent, in a small amount, from its flowing into the area of the microlens 23 even if the front-end of the fillet of the bleed 32 is extending toward the area.

Figure 2:
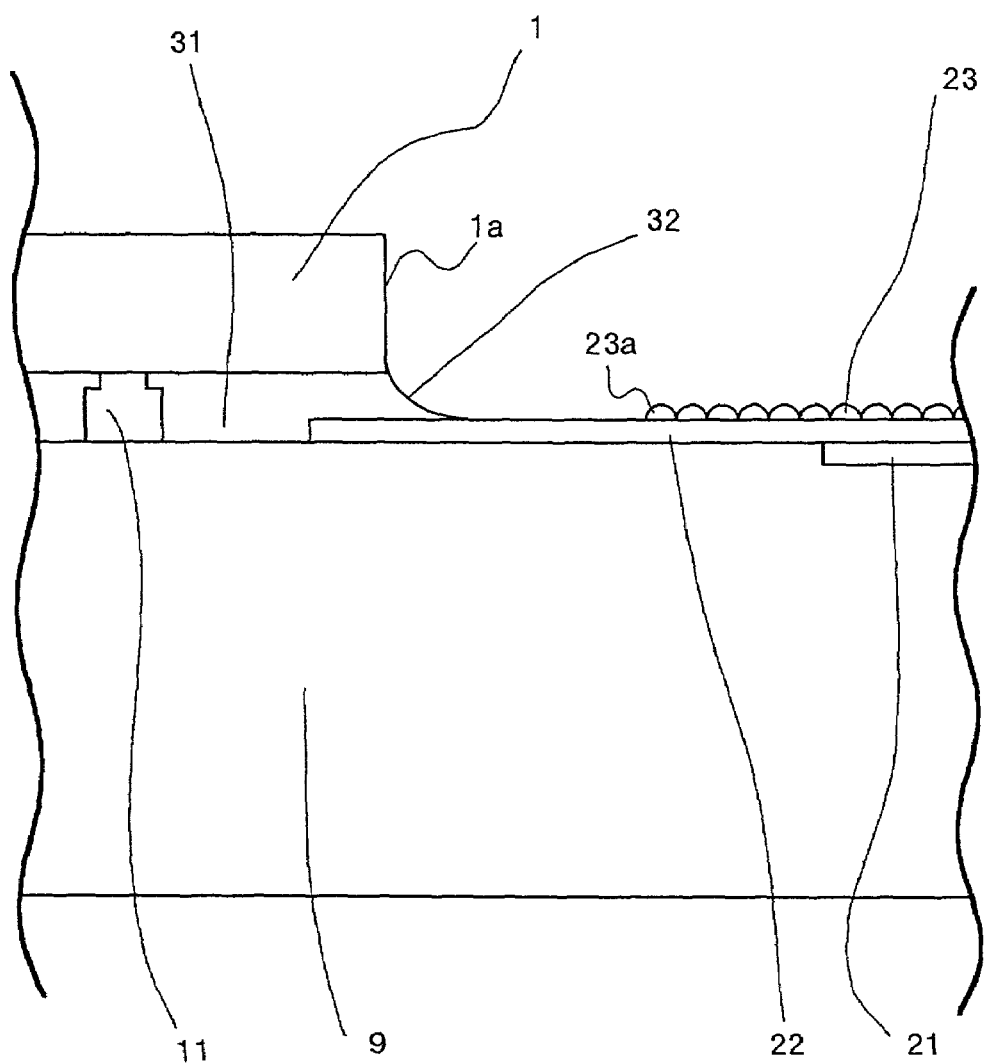
FIG. 2 is a cross-sectional view of a solid-state image pickup apparatus according to a second embodiment of this invention.

FIG. 2 shows an enlarged cross-sectional view of the portion of the flip-chip bonding pad section 11 in the solid-state image pickup apparatus according to a second embodiment. FIG. 1 shows the structure in which the stage formed by aligning the edge of the color filter 22 and the edge 23a of the mocrolens. On the contrary, FIG. 2 shows the structure where there is no such stage. The distance between the microlens-side edge 1a and the edge 23a of the microlens is 2.5 time or more wider as the space between the FPC 1 and the solid-state image pickup device 9. Accordingly, same advantage as in the first embodiment can be achieved.

Figure 3:
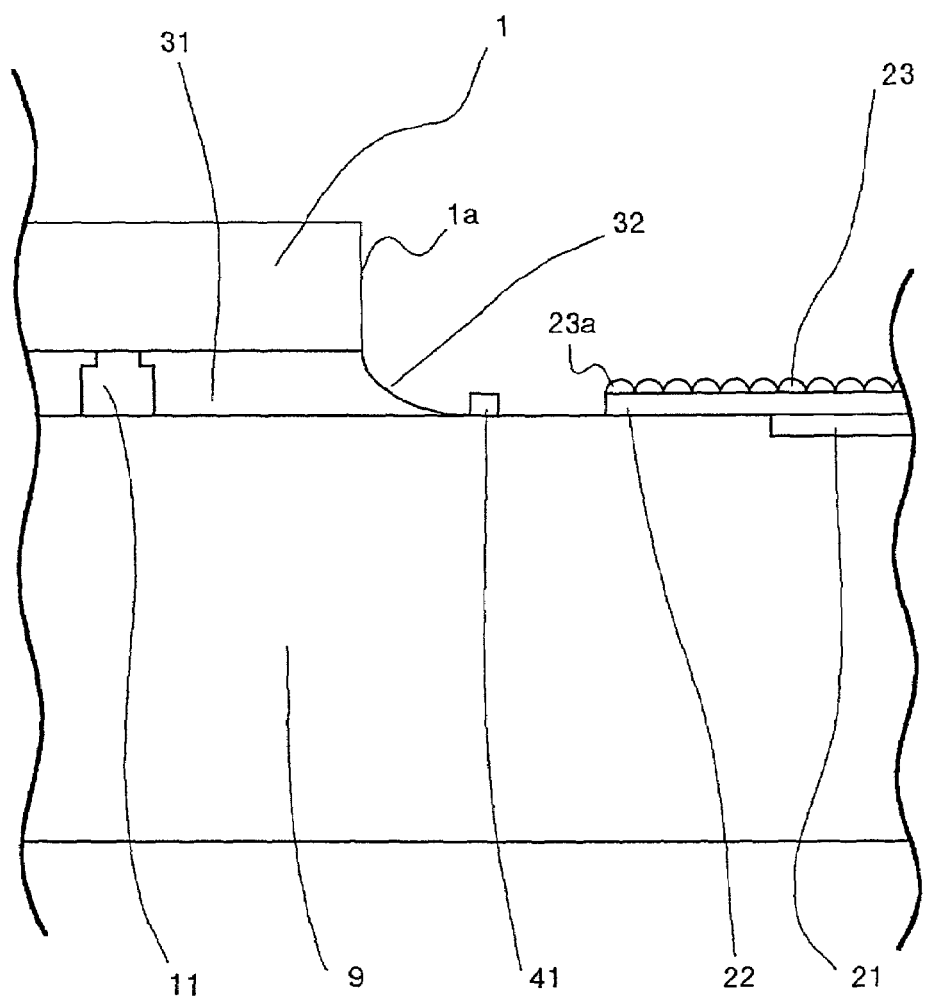
FIG. 3 is a cross-sectional view of a solid-state image pickup apparatus according to a third embodiment of this invention.

FIG. 3 shows an enlarged cross-sectional view of the portion of the flip-chip bonding pad section 11 in the solid-state image pickup apparatus according to a third embodiment. Legend 41 represents a projection formed on the surface of the solid-state image pickup device 9. This projection 41 is provided between the microlens-side edge 1a and the edge 23a of the microlens so as to become an obstacle and stop the flow of the solvent from the fillet of the bleed 32 of the underfill 31. Accordingly, the solvent of the underfill 31 can be prevented from its reaching to the microlens and spreading over a large area due to the capillary phenomenon. Since the solvent does not reach up to the image pickup area 21, the optical characteristics of the microlens 23 are not disturbed by the solvent of the underfill 31. Thus, the light can be focused on the photodiodes of the pixel area 21, and the reduction in its image pickup sensitivity can be prevented.

It is easy to make the bank section 41 with the same material as that of the color filter 22. However, a wiring material such as aluminum or a material such as resin, which can be formed on the solid-state image pickup device, may be used.

Figure 4:
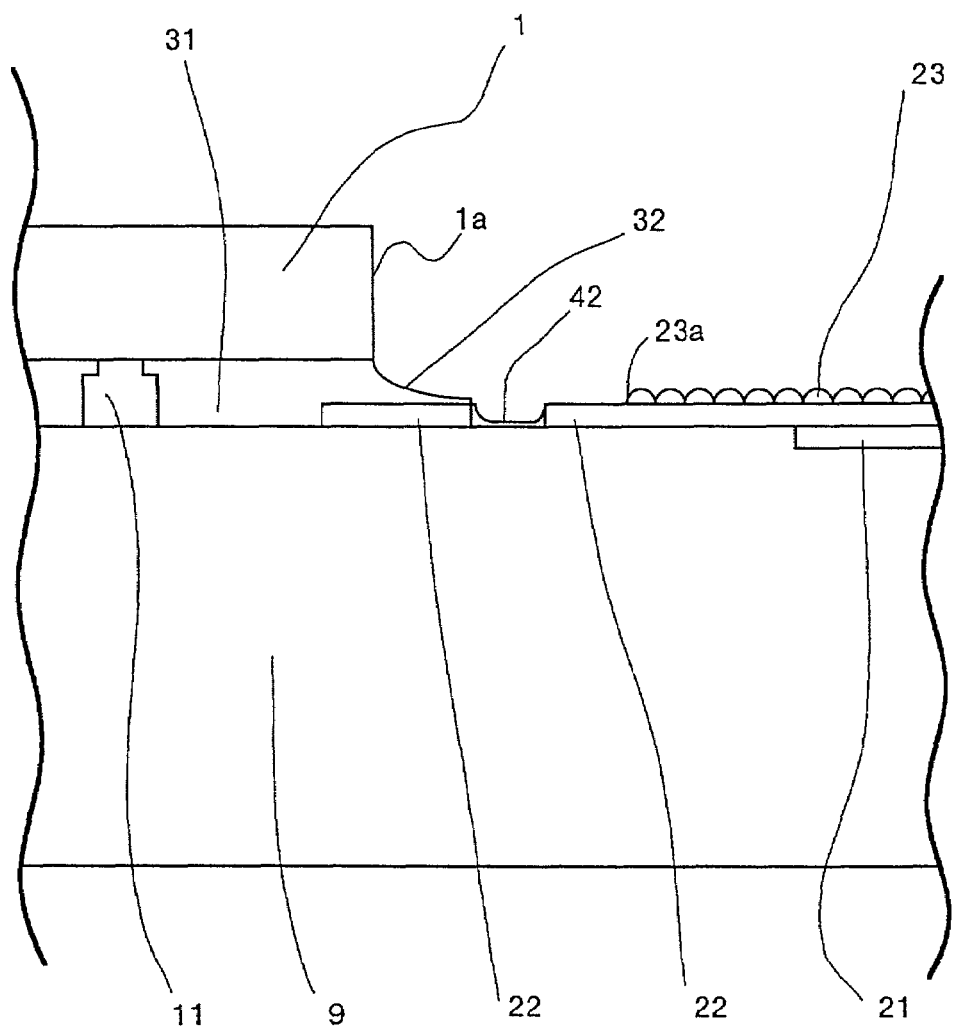
FIG. 4 is a cross-sectional view of a solid-state image pickup apparatus according to a fourth embodiment of this invention.

FIG. 4 shows an enlarged cross-sectional view of the portion of the flip-chip bonding pad section 11 in the solid-state image pickup apparatus according to a fourth embodiment. Legend 42 represents a groove section formed on the surface of the solid-state image pickup device. The groove section 42 is provided between the microlens-side edge 1a and the edge 23a of the microlens so as to accumulate the extra solvent and to stop the flow of the solvent from the fillet of the bleed 32 of the underfill 31. Accordingly, the solvent of the underfill 31 can be prevented from its reaching to the microlens and spreading over a large area due to the capillary phenomenon. Since the solvent does not reach up to the image pickup area 21, the optical characteristics of the microlens 23 are not disturbed by the solvent of the underfill 31. Thus, the light can be focused on the photodiodes of the pixel area 21, and the reduction in its image pickup sensitivity can be prevented.

It is easy to make the groove section 42 with the same material as that of the color filter 22. However, a wiring material such as aluminum or a material such as resin, which can be formed on the solid-state image pickup device, may be used.

Figure 5:
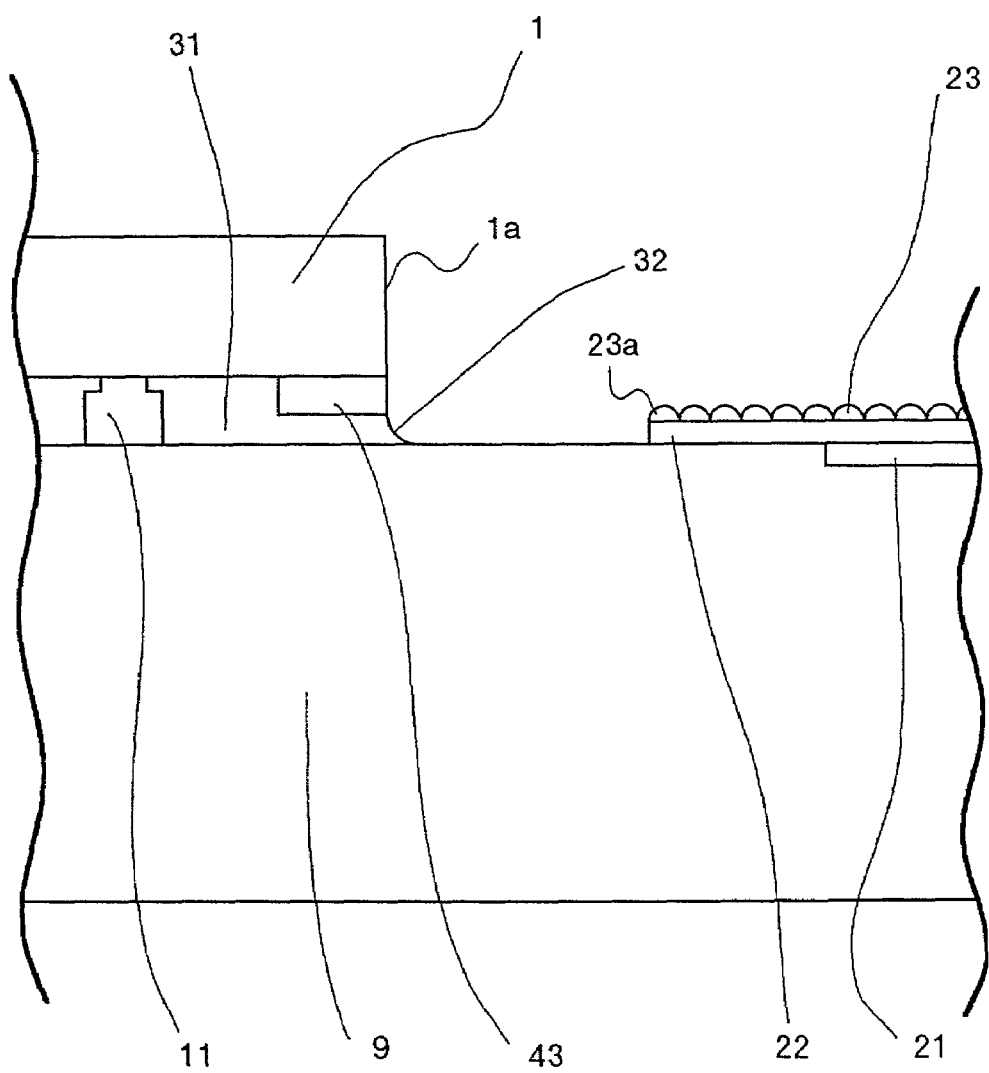
FIG. 5 is a cross-sectional view of a solid-state image pickup apparatus according to a fifth embodiment of this invention.

FIG. 5 shows an enlarged cross-sectional view of the portion of the flip-chip bonding pad section 11 in the solid-state image pickup apparatus according to a fifth embodiment. Legend 43 represents a bank section formed near the microlens-side edge 1a. This bank section 43 stops the flow of the solvent from the fillet of the bleed 32 of the underfill 31. Accordingly, the solvent of the underfill 31 can be prevented from its reaching to the microlens and spreading over a large area due to the capillary phenomenon. Since the solvent does not reach up to the image pickup area 21, the optical characteristics of the microlens 23 are not disturbed by the solvent of the underfill 31. Thus, the light can be focused on the photodiodes of the pixel area 21, and the reduction in its image pickup sensitivity can be prevented.

As explained above, according to this invention, even if the bleed 32 of the underfill 31 is formed and the solvent of the underfill is flown out from the fillet of the bleed, the solvent is not allowed to touch the microlens 23. Therefore, the solvent can be prevented from its flowing into the area of the microlens 23 due to the capillary phenomenon, so that the optical characteristics of the microlens 23 can not be disturbed by the solvent of the underfill 31. Thus, the light can be focused on the photodiodes of the image pickup area 21, and the reduction in its image pickup sensitivity can be prevented.

Accordingly, in the solid-state image pickup apparatus in which a solid-state image pickup device is provided on one side of the flexible printed circuit board and an optical lens held by a casing is provided on the other side of the board and the solid-state image pickup device is flip-chip bonded to the flexible printed circuit board, a large amount of underfill can be flown into the bonded sections. Therefore, since the flip-chip bonding pad sections of the solid-state image pickup device can be secured and firmly maintained to keep their good contact state, and the solid-state image pickup apparatus can be manufactured stably, it is possible to obtain a compact and high-performance solid-state image pickup apparatus with high reliability, which is adequate for miniaturization of a solid-state image pickup apparatus.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A solid-state image pickup apparatus comprising:
   a flexible printed circuit board having first and second surfaces and an opening through the flexible printed circuit board, the opening being defined by an edge of said flexible printed circuit board;
   a solid-state image pickup device flip-chip bonded to the first surface of said flexible printed circuit board opposite and facing the opening; and
   an optical lens, held by a frame, and located on the second surface of said flexible printed circuit board, opposite and facing the opening, wherein
      distance between an edge of a microlens area of said solid-state image pickup device located within the opening and the edge of said flexible printed circuit board defining the opening is between 2.5 times to 10 times wider than a space between the first surface of said flexible printed circuit board and said solid-state image pickup device,
      the edge of the microlens area is located within the opening in said flexible printed circuit board, and
      the microlens area is larger than an image pickup area, and the edge of the microlens area is located between the edge of said flexible printed circuit board defining the opening in said flexible printed circuit board and an edge of the image pickup area.

2. A solid-state image pickup apparatus comprising:
   a solid-state image pickup device having a microlens layer opposite a color filter; and
   a flexible printed circuit board having first and second surfaces and an opening extending through said flexible printed circuit board, the opening being defined by an edge of said flexible printed circuit board, wherein
      said solid-state image pickup device is flip-chip bonded to the first surface of said flexible printed circuit board opposite the opening by an adhesive in a gap between said solid-state image pickup device and the first surface of said flexible printed circuit board,
      distance between an edge of said microlens layer and the edge of said flexible printed circuit board defining the opening in said flexible printed circuit board is 2.5 times to 10 times wider than the gap between said solid-state image pickup device and the first surface of said flexible printed circuit board,
      said microlens layer covers a microlens area that is larger than an image pickup area, and
      an edge of the microlens area is located between the edge of said flexible printed circuit board defining the opening in said flexible printed circuit board and an edge of the image pickup area.

3. The solid-state image pickup apparatus according to claim 2, wherein the edges of said microlens layer and said color filter layer are aligned, forming a stage.

* * * * *